United States Patent [19]

Heinecke et al.

[11] Patent Number: 4,935,661
[45] Date of Patent: Jun. 19, 1990

[54] PULSED PLASMA APPARATUS AND PROCESS

[75] Inventors: Rudolf A. Heinecke; Sureshchandra M. Ojha; Ian P. Llewellyn, all of Essex, Great Britain

[73] Assignee: STC plc, London, England

[21] Appl. No.: 879,039

[22] Filed: Jun. 26, 1986

[30] Foreign Application Priority Data

Jun. 29, 1985 [GB] United Kingdom ............... 8516537

[51] Int. Cl.$^5$ ............................................. H01J 7/24
[52] U.S. Cl. ........................... 313/231.31; 313/362.1; 315/111.21; 315/111.91
[58] Field of Search ............... 313/231.31, 362.1; 315/111.21, 111.91

[56] References Cited

U.S. PATENT DOCUMENTS

| | | | |
|---|---|---|---|
| 2,883,580 | 4/1959 | Kilpatrick | 315/111.91 |
| 3,988,566 | 10/1976 | Vogts et al. | 315/111.21 X |
| 4,645,977 | 2/1987 | Kurokawa et al. | 313/231.31 X |

Primary Examiner—Donald J. Yusko
Assistant Examiner—Sandra L. O'Shea
Attorney, Agent, or Firm—Lee & Smith

[57] ABSTRACT

An apparatus for pulsed plasma treatment of a substrate surface includes means for removing spent gas from a region adjacent the substrate for each pulse. The apparatus may also include means for sweeping an intense plasma region across a substrate surface. Rapid gas exchange is provided by pressure pulsing the gas admission. This facility also provides means for rapidly alternating different gases.

8 Claims, 6 Drawing Sheets

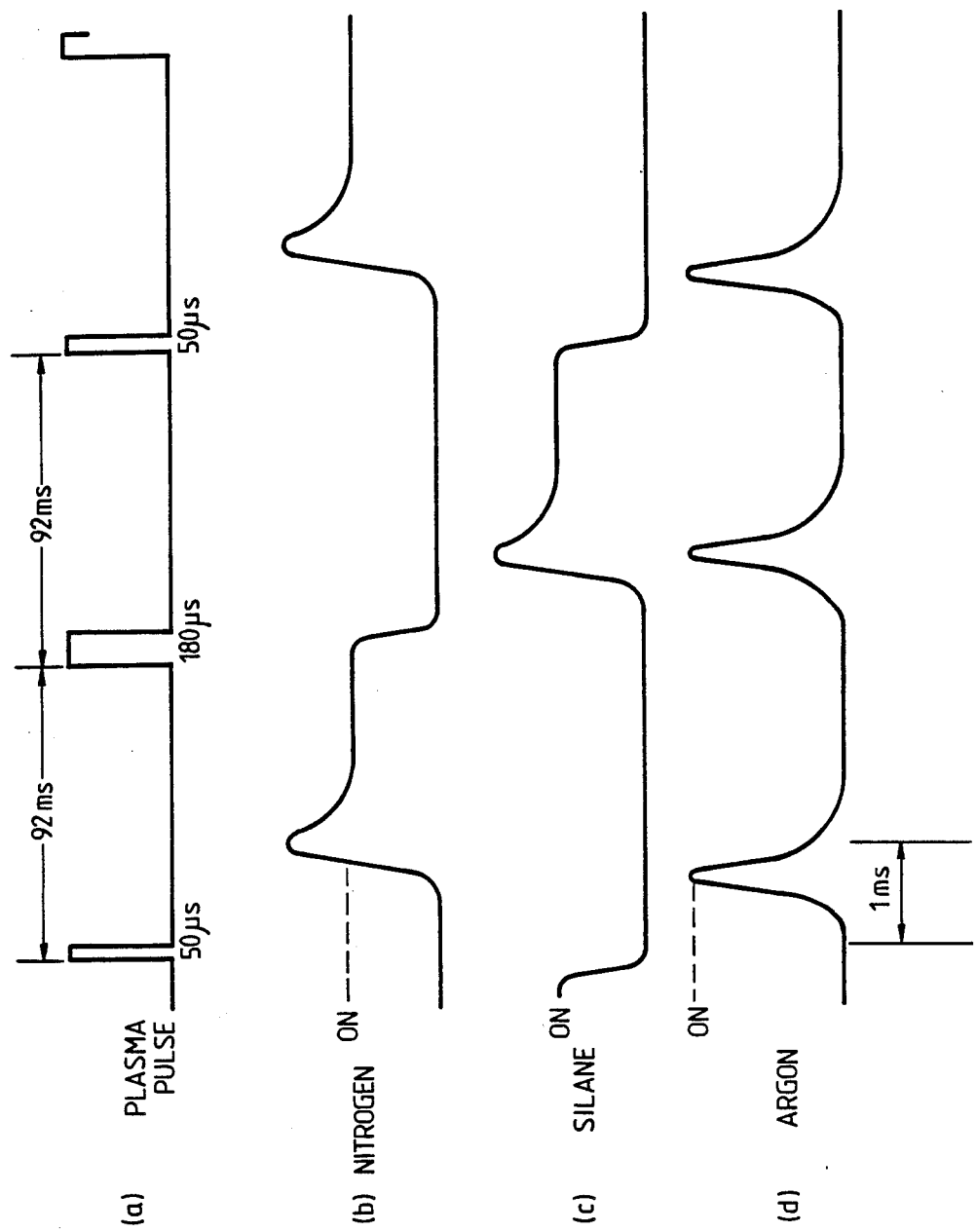

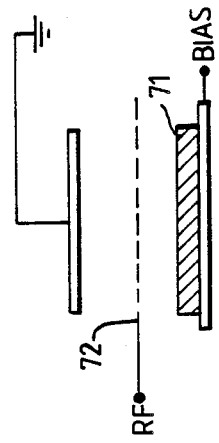
Fig.7.
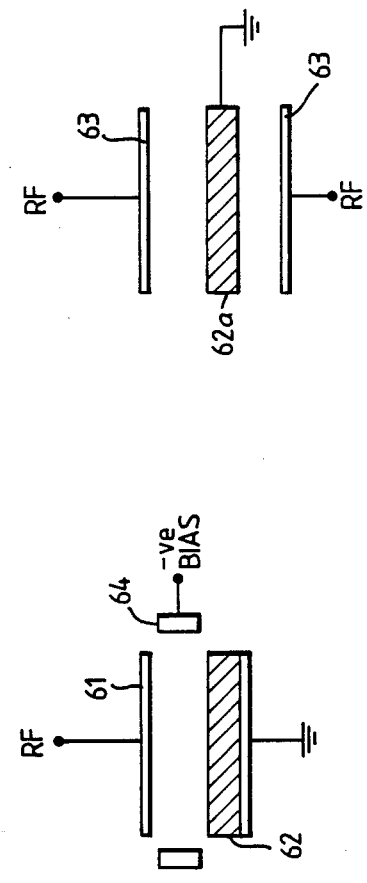
Fig.6a.
Fig.6.
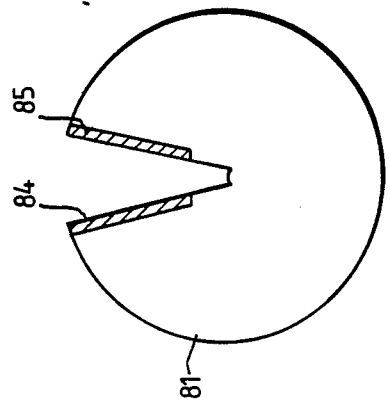
Fig.8a.
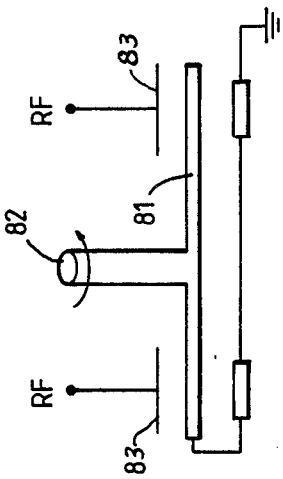
Fig.8.

PULSED PLASMA APPARATUS AND PROCESS

This invention relates to apparatus and processes for pulsed plasma treatment of a substrate surface.

Plasma processing, and in particular low temperature glow discharge plasma processing, is potentially a very useful process for the surface processing of substrate materials. As a source of high energy radiation it can promote both physical and chemical changes at the surface of the substrate and can be used for etching, roughening, polymerisation, cross-linking, adhesion promotion, grafting and coating of the surface. It is possible to include more than one of these processes during a treatment so that one can sequentially carry out surface etching, cross-linking and layer or multilayer deposition of a substrate by simply changing the gas composition. Such a process ensures the maximum possible adherence and compatability between different deposited layers and avoids other problems such as internal optical reflection caused by abrupt interfaces.

However, the deposition of coatings in normal discharges requires substrate temperatures in excess of 250° C. (too high for most plastic substrates for example). The reason for this is probably the relatively low degree of molecular dissociation in the normal discharges. The species arriving at the substrate surface therefore requires additional energy for further decomposition and for structural arrangement of the coating. This has therefore limited the use of plasma in surface processing of many materials and in particular heat sensitive materials such as plastics.

The major disadvantages of conventional plasma processing techniques have been overcome by the introduction of pulse plasma processes such as those described in our published UK specification No. 2,105,729 (R. A. H. Heinecke et al 30-2-2 and in our co-pending applications Nos. 8505288 (R. A. H. Heinecke et al 37-5), 8505319 (R. A. H. Heinecke et al 38-6-1), 843122 (R. A. H. Heinecke et al 39-7-2), and 8505320 (R. A. H. Heinecke et al 40-8-3).

The conventional continuous plasma process suffers from a number of further disadvantages. These include:
Intermixing of the reaction products with the plasma.
Gas phase addition reactions.
Contamination from reactor vessel walls.
Redeposition of etching products.
Limited capability to cross-link plastics.
Spatial depletion effects.
Poor gas exchange in flow shadows.
Slow deposition/etching rate.
Limited control on the degree of plasma dissociation.
High deposition temperatures.

The object of the present invention is to minimise or to overcome these disadvantages.

According to the present invention there is provided an apparatus for pulsed plasma processing of a substrate surface, the apparatus including a reactor chamber, a high power radio frequency pulse generator whereby, in use a substantially fully dissociated plasma is generated in the chamber, means for evacuating the chamber, means for applying active or inert gases to the chamber, and means for controlling the inlet means relative to the evacuation means whereby the chamber or a region thereof is substantially depleted of reaction products in the period between successive generator pulses.

According to another aspect of the invention there is provided an apparatus for pulsed plasma processing of a substrate surface, the apparatus including a reactor chamber, a high power radio frequency pulse generator whereby, in use, a substantially fully dissociated localised plasma is generated in the chamber, means for evacuating the chamber, means for supplying active or inert gases to the chamber, and means for traversing the plasma across the substrate surface whereby, at a given instant, only part of the substrate surface is in contact with the plasma.

According to a further aspect of the invention there is provided a process for pulse plasma treatment of a substrate surface, the process including exposing the surface to an atmosphere under reduced pressure, applying a high power pulsed radio frequency field to a region surrounding or adjacent the substrate thereby substantially fully dissociating the gas and effecting said surface treatment, and exchanging the atmosphere at least in a region adjacent the substrate surface so as to remove reaction products from that region.

The term radio frequency as employed herein is understood to include microwave frequencies.

The apparatus and process described hereinafter provide a number of significant operating conditions that are advantageous for successful plasma treatment. The preferred conditions that are provided can be specified as follows:

| | |
|---|---|
| 1 | R.F. or microwave power between 100 W/cm$^3$ and 1000 W/cm$^3$, sufficient to achieve full dissociation in the gas. |
| 2 | Pulse width between 10 microseconds and 500 microseconds, of suitable duration to achieve full dissociation of the gas or gas mixture; or, for some etching applications, to achieve a specific degree of dissociation. |
| 3 | Pulse intervals (pulse repetition rate or duty cycle) to achieve a specific low average power density (e.g. 0.5 W/cm$^3$) for operation near room temperature. For higher temperature operation (e.g. for metal parts or for low temperature epitaxy) much higher average power (up to 10 W/cm$^3$) may be used. Alternatively, when the pumping speed is limited, longer pulse intervals are used to match the gas exchange rate attainable. |
| 4 | Size of pump stack and throttle such that the pumping speed is matched to the pulse repetition rate. |
| 5 | Gases are chosen to achieve the desired function, i.e. surface treatment, etching, or deposition. Gas sequences are provided for phasing from one function to another or for phased layer deposition. |
| 6 | Partial pressure of reactant (particularly the "solid" carrying) gases such as to give deposition (or etching) rates of one tenth to one monolayer per pulse (i.e. between 10 and 100 mtorr) for high performance applications. For less demanding deposition applications several monolayers per pulse (i.e. partial pressure up to 2 torr) may give acceptable layer quality at very much increased deposition rates. |
| 7 | An inert gas (e.g. He or Ar) may be added to a total pressure up to 2 torr in order to enhance throwing power. |
| 8 | Gases applied continuously through mass flow controllers, in conjunction with conditions 1.4 and 1.5 to achieve a fresh gas condition at the beginning of each pulse. |
| 9 | Gas inrush pulsed using ON/OFF valves in series with mass flow controllers, so as to achieve fresh gas condition at the beginning of each plasma pulse. |
| 10 | Gas pulsing arranged so as to discharge with each pulse a small pressurised cavity, in order to achieve a rapid gas exchange. |

| | -continued |
|---|---|
| 11 | Inert gas (or gaseous second reactant) pulsing arranged such as to achieve occasional pressure pulsations in the reactor in order to assist gas exchange in 'dead' volumes; various arrangements are conceivable: (a) a separate gas pulse between the reactant gas pulses (slow, but least interference from reaction products); (b) a rapid pressure wave during each OFF period; (c) where reactions are performed by successive admission of reactive components, the operating pressure of the 'gaseous'component (e.g. $N_2$) to be higher than that of 'solid'carrying component (e.g. silane) in deposition reactions. |
| 12 | Central process control facility interacting with pulsed power generator and gas handling components to enable the following operating modes: (a) phased treatment sequences (e.g. surface modification - etching - deposition) (b) phased layer deposition (e.g. organic - semiorganic - inorganic I - inorganic II) (c) deposition of chemical compounds by the successive admission of reactants with individually controlled plasma pulse patterns (e.g. 50-180-50 microseconds for $SiH_4$—$N_2$—$SiH_4$ reactants) (d) etching reactions involving complex reaction products by the successive admission of reactants (e.g. $Cl_2$—CO—$Cl_2$ to form chlorocarbonyls) (e) deposition of complex interleaved layer structures from elemental materials (one reactant per layer) or chemical compounds (two or more reactants per layer; each constructed preferably in mode c) and deposition of multilayer structures with hard interfaces e.g. for optical components. |
| 13 | Sample temperature controlled by external means (cooling and/or heating), or by increasing the average plasma power (pulse widening and/or increased repetition rate) for controlled heating. In the latter case the samples are preheated in inert gas. Since the increase in pulse repetition rate entails correspondingly faster gas exchange rate, a higher temperature may also imply faster deposition. |
| 14 | Provision for occasional long pulses to achieve surface temperature bursts for surface melting of plastics or film 'hardening' effects, without increasing significantly the bulk temperature. |

Embodiments of the invention will now be described with reference to the accompanying drawings, in which:

FIG. 5 shows a typical gas supply sequence;

FIGS. 6, 6a and 7 illustrate forms of plasma reactor;

FIGS. 8 and 8a show a modified plasma reactor;

Figure 1:
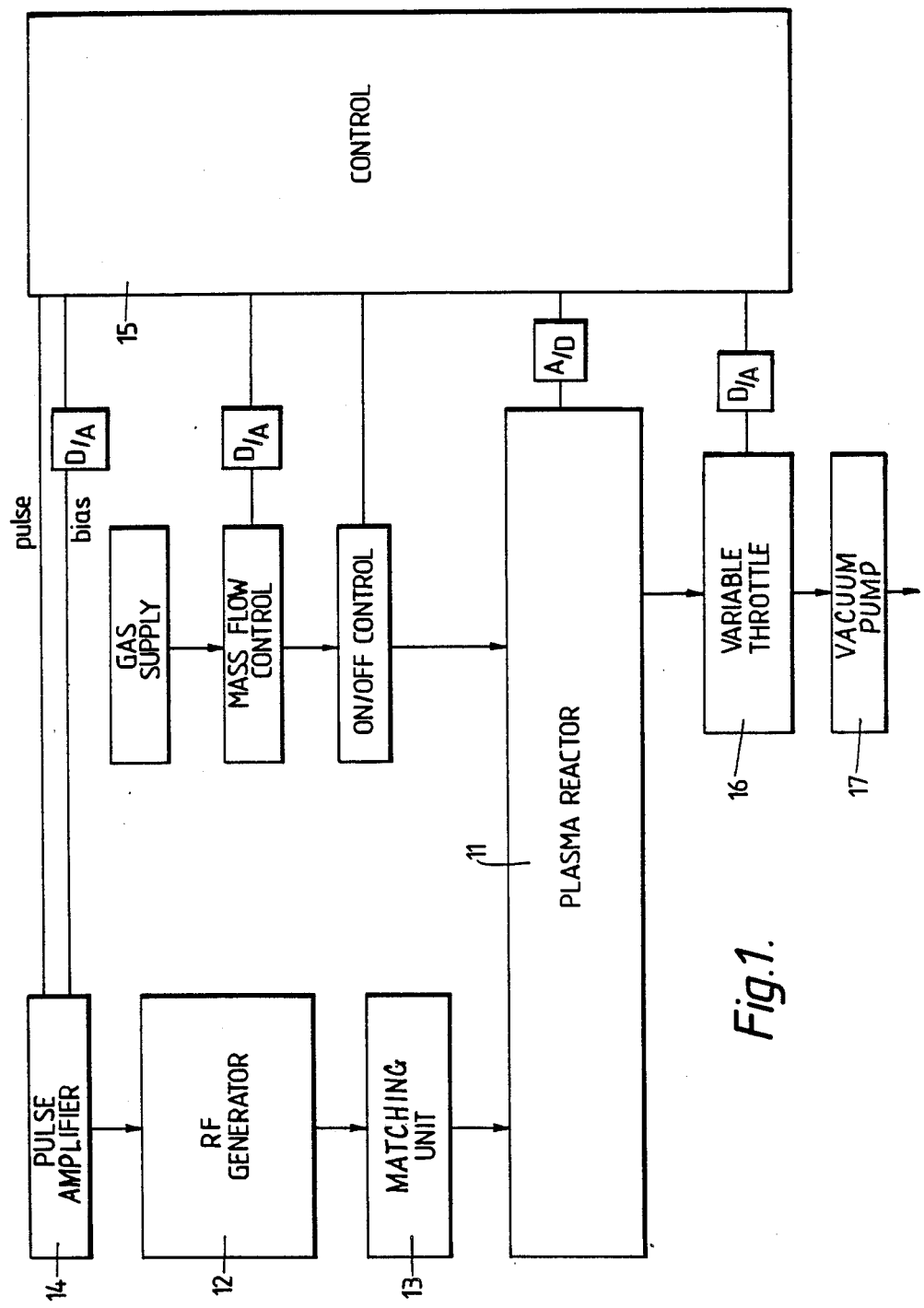
FIG. 1 is a schematic diagram of an apparatus for pulsed plasma processing.

Referring to FIG. 1, the apparatus includes a plasma reactor 11 within which a pulsed radio frequency plasma is maintained by a generator 12 and an associated impedance matching unit 13. The generator is driven via a pulse amplifier 14 from a central control 15, e.g. a microprocessor. The control 15 also controls a gas supply to the reactor 11 and the rate at which the reactor is evacuated via a variable throttle 16 and a vacuum pump 17. The throttle 16 allows control of the rate at which gas is drawn from the chamber by the vacuum pump 17'. The gas supply, i.e. a plurality of gases or gas mixtures, is fed to the reactor via a set of mass flow controllers 18 and ON/OFF controllers 19. Coupling of the microprocessor 15 to the system controls may be effected via A/D and D/A converters. It will be clear that as the microprocessor is a digital device it is necessary to provide an interface between the digital microprocessor and the analogue device coupled to the microprocessor.

Figure 2:
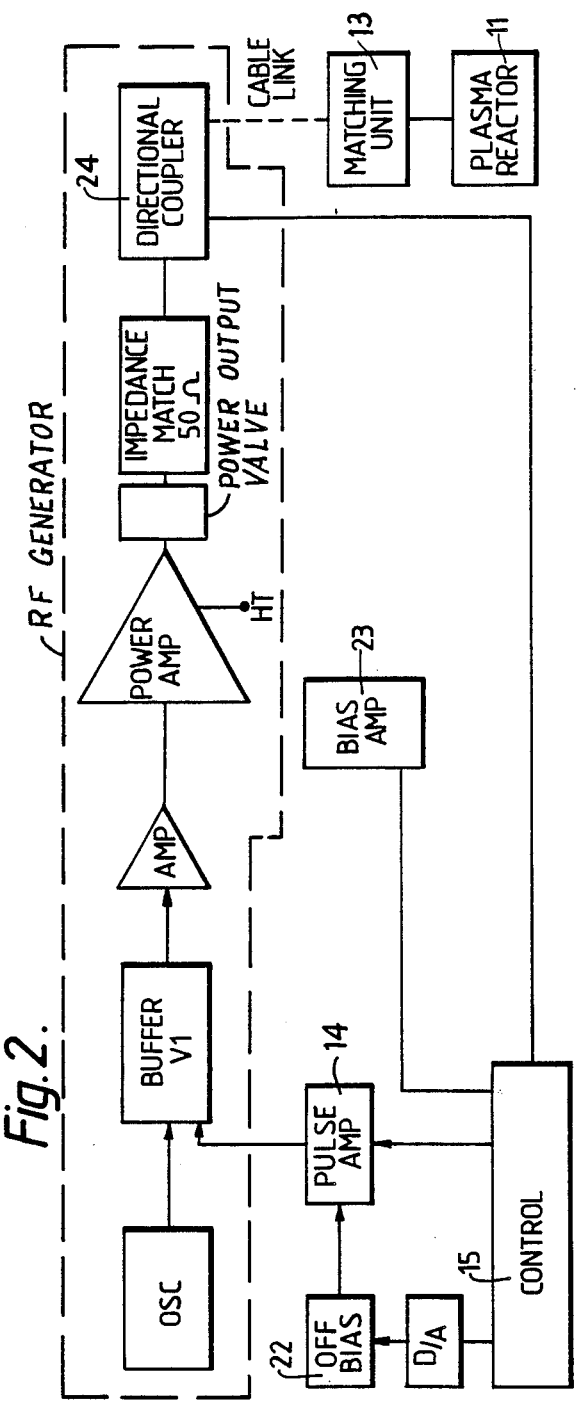
FIG. 2 is a schematic diagram of a pulse generator.

FIG. 2 shows the preferred features of a pulsed r.f. generator. The pulse amplifier 14 applies a strong negative bias (e.g. −180 V) to the grid of the buffer stage valve VI of the generator during the pulse intervals. As is well known, a radio frequency generator includes an oscillator, a power output valve and a buffer stage and amplifying means therebetween. The power output valve is coupled to a directional coupler via an impedance matching stage. A signal from the microprocessor 15, or a pulse generator, reduces this bias typically to −30 V during the pulse thus turning the generator ON for the duration of the pulse.

Some pretreatment and etching applications have been found to benefit from maintenance of a weak plasma during the OFF period. A second input 22 to the buffer may therefore be provided through which the negative bias may be varied to maintain a weak plasma in this interpulse period.

Also provided is a processor controlled bias amplifier 23 for automatic peak power control. At the beginning of a treatment process this facility enables the operator to determine the appropriate impedance matching condition before full power is applied. A typical treatment process is started at low peak power levels using an inert gas (e.g. helium) until the automatic impedance matching unit 13 fed from the directional coupler 24 e.g. via a cable link has found its matching values. This is indicated by a minimum reflected to forward power ratio by the directional coupler circuit 24 and communicated to the processor 15. The peak power level may then be increased to its operating value and the inert gas changed to the operating gas.

Applying a pulse to the buffer stage of the generator limits the rise and fall time of the pulse to 10–20 microseconds due to the capacitance of the grid and its driving electronics. This is undesirable since it limits the smallest pulse width to about 30–40 microseconds whereas for certain deposition (e.g. metals from metal alloys) smaller pulse widths allow greater control of the fragmentations of the gaseous precursor and hence greater control over film quantity. An alternative approach is to switch the oscillator signal to the buffer stages. The low powers handled at this stage make transisterised switching possible with nanosecond switching times. In addition zero voltage crossing detection circuitry can be employed to minimize R.F. interference on switch on.

The detection of the pulse powers using directional couplers in real time is complicated by the capacitance in the couplers. This leads to rise and fall times of about 20 microseconds for typical commercially available directional couplers. In order to monitor the pulse in real time it is best to monitor the R.F. voltage on the line using a capacitance voltage divider and a redifier network. In this way pulse widths can be measured very accurately.

Figure 3:
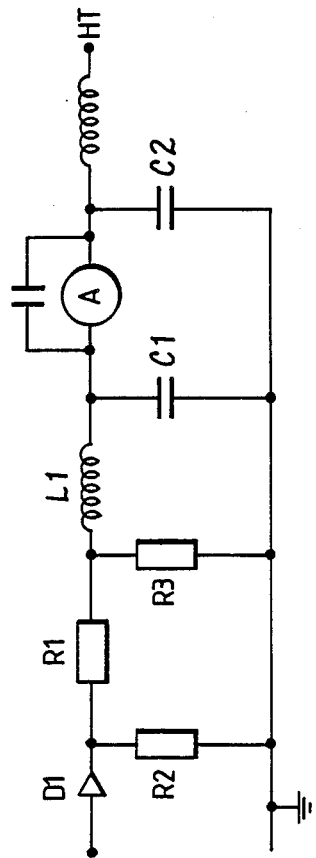
FIG. 3 shows the HT supply circuitry of the generation of FIG. 1.

The high voltage (HT) supply circuitry of the generator is shown in FIG. 3. This circuit protects the power supply against the sudden power surges at the beginning of the pulse. The capacitor bank (C1, C2) provides the pulse energy and is charged during the OFF or interpulse period through resistor R1 and inductor L1. In a typical construction, a 13 MHz r.f. generator (nominally 25 kW), a HT capacitor bank (C1, C2) of 6 microfarads and a charging resistor of 60 ohm (1 kW) have been found sufficient to supply peak power up to 50 kW (1 to 10% reflected power) without detectable RFI. Pulse widths between 10 microseconds and 10 milliseconds and pulse repetition rates between 2 and 200 Hz have been tested at 50 kW peak power without RFI problems.

Figure 3A:
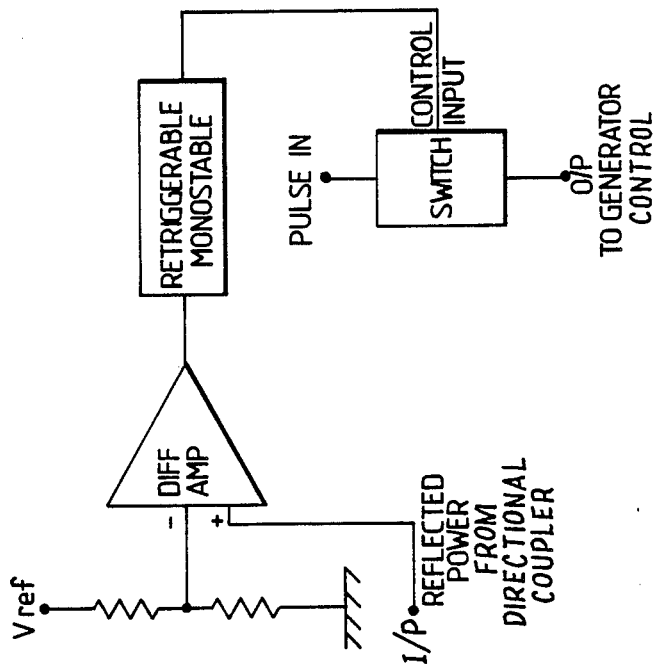
FIG. 3a shows a protection circuit for use with the power supply of FIG. 3.

Occasionally high power pulses cause the development of an arc plasma on internal R.F. electrodes. Damage to the electrode can be avoided by immediate removal of the R.F. power for the duration of the offending pulse. This is achieved automatically by the circuit shown in FIG. 3a. The sensing signal may be derived from either the reflected from the R.F. line voltage to the matching unit. In the arrangement of FIG. 3a, the reflected power at the directional coupler is compared with a reference voltage $V_{ref}$ by a differential amplifier. When the reflected power exceeds a predetermined value the amplifier output operates a retriggerable monostable circuit to switch off the R.F. generator via the control 15 (FIG. 1).

The frequency of the generator may be between 0.1 and 500 MHz, and preferably between 0.5 and 60 MHz for ease of coupling and size of coupling components. Alternatively, microwaves may be used, dependent on size and shape of the samples to be treated.

The main requirement of the generator is its ability to deliver sufficient peak power to achieve full chemical dissociation of the reactant gases in the reactor. Measurements have shown that this requires at least 100 W/cm$^3$ for less stable gases (e.g. silane), and at least 300 W/cm$^3$ for stable gases such as nitrogen. For the calculation of the power requirements it is important to take into account only the volume the intense plasma occupies, and not that of the whole reactor.

Using a generator of the type shown in FIG. 1 together with a plasma reactor comprising a 50 mm diameter silica tube, peak powers up to 50 kW at 13.56 MHz have been inductively coupled into a silane/nitrogen mixture of about 100 mtorr total pressure. A very intense plasma was observed in the form of an annular cylinder of about 8 mm thickness spaced about 4 mm from the wall. To effect coupling to the plasma a copper strip coil about 15 cm in length was placed around the reactor. Therefore at a generator power of 50 kW, the power density inside the intense plasma regime was about 400 W/cm$^3$. The degree of dissociation in silane and nitrogen was determined by emission spectroscopy. At 300 W/cm$^3$ nitrogen was fully dissociated after 180 microseconds, and silane after about 50 microseconds.

In a similar arrangement but using a parallel plate reactor with an active electrode area of 10 cm diameter the generator was operated up to 40 kW peak power. An intense plasma about 10 mm thick covered the area of the active electrode giving a peak power density up to 500 W/cm$^3$.

Figure 4:
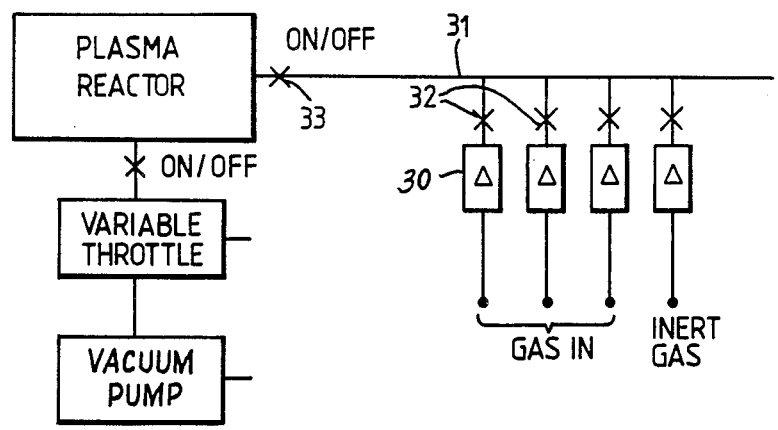
FIGS. 4 and 4a illustrate features of the gas handling system of the apparatus of FIG. 1.
Figure 4A:
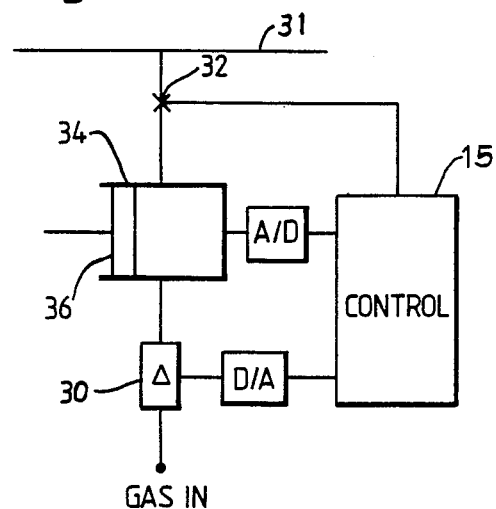

FIGS. 4 and 4a show the arrangement of the gas handling components which allow rapid and controlled gas exchange manipulations. The arrangement differs from conventional processing techniques where a gas flow is set and the system pressure is adjusted through a throttle valve which controls the pumping speed. In the present technique the pumping speed is closely related to the pulse repetition rate in order to achieve one gas exchange for each plasma pulse. Therefore, the gas flow rates are adjusted in order to achieve the desired partial and absolute pressures. These relationships are controlled through the central control unit 15 (FIG. 1) in conjunction with A/D and D/A converters. The minimum size of the pumping stack required at a given working pressure is determined by the reactor volume times the maximum pulse repetition rate demanded by the process.

The arrangement shown in FIG. 4 provides a facility for changing the reactant gas from one gas to another with each plasma pulse (or succession of pulses). FIG. 4 shows a preferred gas manifold arrangement, the features of which are:

a common gas line 31 a fast operating ON/OFF valve 32 associated with a flowmeter 30 in each gas line, and directly joined on to the common gas line an inert gas line joined to the end of the common gas line an optional ON/OFF valve 33 close to the reactor if more than one such manifold is required. This valve 33 may also be used in combination with valve 32 to maintain higher average pressure in the common line during gas pulsing which improves the gas exchange rate by lowering the impedance of the line.

The diameter of the common line 31 is typically between 12 and 50 mm, depending on its length. The inert gas at the end enables flushing of the common line at the end of each pulse. Other gas inlet configurations may of course be employed.

To assist gas exchange a gas pulse facility may be provided by the arrangement of FIG. 4a. This consists of a vessel 34 which, in operation, is charged via flow meter 30 to a predetermined pressure and, at the appropriate time, discharged into the 'common gas line and thence into the rector chamber' through the valve 32.

The amount of gas stored in the vessel 34 should be that which fills the reactor to the required operating pressure measured by the control 15, which pressure may change from pulse to pulse, and which is then maintained via the flow meter 30 during the remainder of the plasma pulse. Vessel 34 thus also acts as a buffer to prevent the mass flow controller trying to follow the pulsings.

Advantageously, the volume of vessel 34 is adjusted to achieve as high a pressure for the amount of gas required as is compatible with the vapour pressure of the reactant gas which may be a liquid at elevated pressures. The volume may be adjusted through a piston 36 or other means.

The gas inlet into the reactor is designed to ensure good flow randomisation without increasing the flow resistance. This may be achieved by a multitude of small angle forward deflectors. For example, in a reactor of circular cross section the gas stream may be injected tangentially to make use of the circular reactor wall for randomising the gas exchange.

Alternatively a straightforward cross-flow arrangement may be used in which both gas inlet and exit are in line of sight with the intense glow region.

In yet another application the gas inlet lines are arranged in spider fashion symmetrically around the common line 31 which then acts as a mixing chamber.

As an illustration of the techniques described herein a gas handling system according to FIG. 4a was set up for the deposition of Si-N coatings in a cylindrical silica reactor of 3.5 liters total volume by sequentially admitting silane and nitrogen gas to a pressure of 120 mtorr and 80 mtorr respectively. The pulse separation was 92 ms. Therefore, the pumping speed was adjusted to 137 m$^3$/hr. to give one gas exchange per pulse. The gas flows to give the desired operating pressure were 240 scc/min for silane and 900 scc/min for nitrogen. These were turned ON and OFF in anti-phase every 92 ms by means of the ON/OFF valves 32. The pulse vessel 34 was set to a volume of about 5 cm$^3$. During the OFF periods the mass flow meters maintained the respective flows to charge the vessel for silane to a pressure of about 55 torr and that for nitrogen to about 85 torr. The high valve and pipe conductance as a result of the high starting pressure allows these gases to be discharged rapidly at the beginning of the respective ON periods, thus establishing the new flow situation at each pulse very much faster than what would have been possible by the pumping speed alone.

In a further process using identical operating parameters, an argon supply connected to the inert gas line was set to a flow of 600 ssc/min to charge vessel 34 to a pressure of about 130 torr. This gas was discharged for about 4 ms just before each of the other gases was turned ON. The associated pressure wave flushed and diluted all reactor parts from the previous gas, particularly in the manifold 31. FIG. 5 illustrates the gas pulse sequences in relation to the electrical power pulse sequences.

Radio frequency power may be coupled to the reaction chamber by capacitive or inductive coupling or by direct coupling to electrodes disposed within the chamber. Many types of reactor are possible and are known to those experienced in the art. Electrodeless types include inductively coupled; capacitively coupled; and microwave cavity coupled reactors.

We have found that the best films are formed under ion bombardment conditions: that is when the substrates are placed on the driven electrode. Electron bombardment of the substrate when placed on the grounded electrode, produces less dense, more highly stressed films. For example silicon siloxide deposited on polycarbonate substrates is hard and stable at 100° C. when deposited under ion bombardment conditions but exhibits stress cracking at room temperature when deposited under electron bombardment. Typical potentials measured on the R.F. electrode during the pulse are about 2000 V but this can be reduced when handling substrates (e.g. gate oxides) that are damaged by high energy ion bombardment. Alternatively the potential may be increased by using a high voltage direct current power supply and capacitor. Bias can also be applied to the (normally grounded) counter electrode to generate a positive or negative counter bias potential. When depositing insulating films (e.g. SiO$_x$, SiN$_x$) the use of a direct current or counter bias control is inappropriate and a R.F. method must be used instead.

When depositing films on insulating substrates using short pulse widths under ion-bomardment conditions the discharge initiates from the exposed electrode area and does not have time to spread uniformly over the substrate. This leads to variation of thickness and quantity of film over the substrate. This can be reduced by placing a metal ring around the electrode area and biasing it negative either using a direct current generator or a R.F. generator. The ring repels electrons towards the centre of the electrode and speeds up the formation of the discharge.

An important specific design feature of the reactor construction is that the intense plasma regime produced during the high power pulse be in contact with, or immediately adjacent, the sample surface. This is essential in order to avoid interference from polyatomic and polymeric species which are always present in significant amounts in weaker plasma regimes. Typically the intense plasma is contained in a region about 1 cm in thickness.

In the electrodeless reactor types the intense plasma region may be directed towards the sample surface by means of suitably shaped reactor walls or inserts. This technique is more fully described in our copending application No. 8431422 (R. A. H. Heinecke 39-7-2).

For electrode-coupled reactor types, FIG. 6 shows the driven electrode 61 in close proximity (typically 10 to 20 mm) to the flat sample surface 62. FIG. 6a shows a similar arrangement for two-sided treatment wherein the sample 62a is supported between the electrodes 63. Magnetic fields may be used for enhanced electron trapping near the electrodes and around the reactor walls.

In the triode arrangement of FIG. 7 the sample 71 is placed in a plasma free zone immediately under the intense plasma next to the driven grid electrode 72. By suitably biassing the sample the ion energy can be varied.

Metal samples may be connected directly to the driven electrode. Such an arrangement is particularly advantageous for wire structures which become completely surrounded by the intense plasma. For example, wire mesh structures may be coated uniformly with a wear resistant and antistick TiN layer.

The largest area that may be treated in a single electrode operation depends on the available generator power. Typically, for a 200 kW generator this area may be up to about 600 cm$^2$.

The simplest form of scaling up the process is to add a cassette to cassette loading facility and to process individual areas or samples sequentially in a single pump down. This may, however, become uneconomic both in process time and generator utilization if low duty cycles have to be used, for example, in order to maintain a low sample temperature. In this case a scanning or 'raster' process allows increased pulse rates to be used.

Two types of scanning may be distinguished, one where the treated area and the high intensity plasma regime are mechanically moved with respect to each other, and another where scanning is provided by switching the r.f. power between a plurality of electrodes.

FIG. 8 shows a parallel plate reactor modified for pulsed operation. An insulating plasma shield 81 on a rotatable shaft 82 is mounted close to the drive electrode 83. As shown in FIG. 8a, a sector-shape opening 84 in the shield is lined with magnets 85 which provide a magnetic field across the opening. With r.f. power applied the magnetic field acts as an electron trap and effects striking and intensifying a local high intensity plasma in the slot. FIG. 8 shows an increasing cross-section towards the periphery of the shield which serves to compensate for the increased width of the opening. Alternatively, magnets with an increasing field strength towards the periphery may be used in order to achieve a uniform radial plasma density.

In operation the shield (and with it the plasma) is rotated at a rate equal to that pulse repetition rate which would be used for a stationary plasma, and the pumping speed is matched to provide one gas exchange per revolution of the shield.

The plasma is pulsed at a rate in accordance with the number of sectors of the intense plasma which would fill the complete circle, that is such that each part of the area passed by the slot has seen one plasma pulse in each revolution of the shield.

In a typical construction, a parallel plate reactor of 100 cm diameter had an electrode and sample area described by 85 cm outer diameter and 35 cm inner diameter. A shield of the same dimensions was mounted on a drive shaft through the lid of the reactor vessel. The shield had a sector shaped opening lined with magnets which, in operation, produced a plasma sector of about 5° subtended angle and about 25 cm long. The theoretical pulse repetition rate was 72 per revolution, in practice it varies between 70 and 80 per revolution to obtain a uniform coating thickness. A 40 kW peak power at 13.54 MHz was used which provided up to more than 500 W/cm$^3$ in the plasma sector.

The gas exchange rate for the reactor was about 5 per second, using a pump stack of nominally 3000 m$^3$/hr pumping speed. A pulse repetition rate of 360 Hz (about every 3 ms) was used and the drive speed for the shield was 300 rpm. Pulse triggering was controlled by a feedback circuit between the drive shaft and the pulse generator.

In an alternative arrangement the samples can be rotated across a stationary intense plasma produced by a sector-shaped electrode. A magnetic field may be used to assist confinement of the plasma. The spacing between the electrode and the sample surfaces must not exceed 20 mm, and preferably is between 5 and 15 mm. The electrode requires good water cooling since the average power is very high.

Rotating drums may be treated using a single electrode, or using a second drum if the drums are electrically conductive. Magnetic confinement may again be used. Reactor dimensioning and operating conditions are essentially the same as those previously described with one gas exchange for each drum revolution.

Drum electrodes may also be used for coating tapes in a reel to reel fashion. In this case two types of operation are possible:

(a) Slow advance: each section of the tape remains in the plasma regime for as long as it is necessary to build a coating by exposing it through the required gas changes (multi-layer, phasing, etc.). The pulse repetition rate is then low and close to that of a stationary situation, and identical to the gas exchange rate.

(b) Fast advance: this is only possible if a single type of material (or operation) is required).

Figure 9:
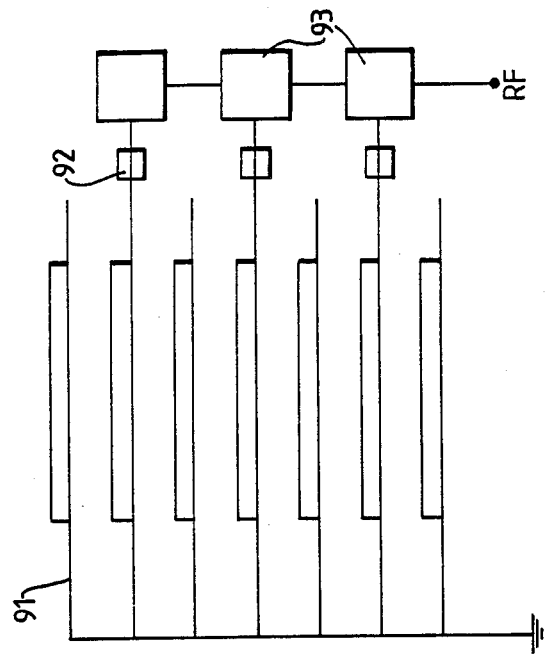
FIG. 9 shows a further plasma reactor arrangement.

In a further application the pulsed r.f. power may be scanned along a sequence of electrodes. The principle is shown in FIG. 9. Each electrode 91 is connected, through suitable matching components 92, to an electronic power switch 93 which is operated by an appropriate signal from the microprocessor control unit (FIG. 1). In operation, the electrodes are turned ON and OFF in succession with each r.f. power pulse thereby moving the plasma regime across the area covered by the electrodes. The electronic power switches are operated only between pulses, that is they function only as circuit breakers and are not required to actually switch r.f. power.

The apparatus described herein can be used in a wide variety of applications. In particular it may be used for deposition of a layered or homogeneous structure using a pulsed gas sequence synchronised with the RF pulses. Thus, for example, an alternating gas sequence of silane and nitrogen may be used to provide a silicon nitride film. In such a sequence one gas may be used to deposit a solid material whilst the other reacts with the deposited material. The solid depositing gas pressure is adjusted typically to give a film thickness of 0.3 to 1 monolayer per pulse. The pressure of the reacting gas should be significantly greater as the surface reaction may be slow. The solid depositing gas may be a hydride, halide, carbonyl or an organo compound of a solid element. The reactant gas may comprise e.g. nitrogen, oxygen or carbon dioxide.

In a further application two solid depositing gases may be alternated to provide a multilayer structure, the gas pressures being adjusted to provide one monolayer per radio frequency pulse.

The process can also be used for the deposition of dielectric refractory films e.g. of $Si_3N_4$, $TiO_2$, $Al_2O_3$, BN, $SiO_2$, $B_4C$. Other refractory films include SiC, WC, TiC, TiN and BP.

The following Examples illustrate the invention. In the Examples gas flow rates are quoted in standard cubic centimeters per minute (cc/m).

EXAMPLE I

Stable $TiN_x$ films were prepared at room temperature using the pulsed gas/pulsed plasma technique using titanium tetrachloride as a precursor. Conventional continuous plasma films are unstable due to the large amount of chlorine present. The films were deposited by discharging at a pressure of 0.1 torr mixtures of $TiCl_4$ (30 cc/m) and $N_2$ (500 cc/m) in one pulse and using a second pulse of $N_2$ to abstract chlorine from the growing film. Using this method, the pulse width was kept long (300 microseconds) so as to fully dissociate the $N_2$ molecules so the resultant atoms could abstract chlorine from the films. It is also important to ensure that the resulting products are pumped away before allowing a fresh film layer to be formed from a $TiCl_4/N_2$ discharge.

EXAMPLE II $TiO_x$ films cannot be formed from $CO_2$ or $O_2$ and $TiCl_4$ directly using the technique of Example I due to oxygen atoms being inefficient at removing chlorine from the films. We have found however that it is possible to produce stable films by the following pulse sequence at a power of 0.1 torr:

(i) Pulse a $TiCl_4N_2$ mixture to form a $TiN_xCl_y$ layer.
(ii) Pulse $N_2$ to remove chlorine $TiN_x$.
(iii) Pulse $CO_2$ to oxidize film $TiN_xO_y$.

The amount of nitrogen inclusion can be further reduced by further pulses of $CO_2$.

EXAMPLE III

Aluminium carbide was formed by discharging trimethyl aluminium (20 cc/m) in argen (300 cc/m) at a pressure of 0.1 torr. Aluminium oxide was produced by depositing a layer of aluminium carbide as above and oxidizing the film in a second pulse of $CO_2$ (500 cc/m).

EXAMPLE IV

Dielectric multilayer optical filters of both the reflection and transmission type were deposited. In a particular application up to 41 layers of λ/4 optical thickness of alternating $SiN_x$ (270–1200 Å, n~1.8–2.0) and $SiO_x$ (350–1400 Å, n~1.4–1.5) were deposited onto glasses and plastic substrates, to form reflection filters with wavelengths in the IR, optical and UV regions of the spectrum. The individual $SiO_x$ layers were deposited from silane and carbon dioxide with the flow of $SiN_4$ interrupted for every other RF pulse to obtain high optical transmission $SiO_x$. The RF power was 40 kW at 13.56 MHz and the pulse width was 100 microseconds with a prf of 30 Hz. The SiN layers were deposited under similar conditions but with $N_2$ replacing $CO_2$, with both gases ($GiH_4$ and $N_2$) flaming continuously, and with a 200 microsecond pulse width (since $N_2$ has a lower dissociation rate than $CO_2$).

As well as film deposition the technique can also be used for etching. For example, using an electrode separation of ~20 mm and argon gas at 140 mtorr the bias voltage on the ground electrode was varied in the region 0 to −500 VDC to obtain an enhanced plasma which increased the etch rate of SiO whilst decreasing the resist degradation on a patterned Si wafer.

In further applications the apparatus can be used in the deposition of transparent conductive films, e.g. for the electrodes of liquid crystal displays, and in the epitaxial deposition of elemental or compound semiconductors.

In all cases the deposited films may be doped with one or more further materials.

The deposited films may be used in optical applications, e.g. interference filters, anti-reflection coatings, beam splitters, polarisers and colour correction filters. Further applications include the formation of superlattices and low dimensional solids.

In etching applications the technique can take advantage of reaction processes that are unsuitable for continuous plasmas. Thus the period after each pulse allows the reaction products to escape under 'cold' conditions preventing redeposition. Etchants such as chlorocarbonyl or chlorine/carbonmonoxide mixtures, may be used in this way e.g. for the etching of platinum, palladium or gold.

In some applications liquid reactants, e.g. $TiCl_4$ or BCl, may be injected into the reaction chamber via an atomiser. This facilitates dispersion of the reactant in the chamber and increases the rate at which such reactants are admitted. Typically an ultrasonic atomiser is used for this purpose.

In other applications the technique can be used for sputtering material from an electrode surface on to a substrate.

It will be appreciated that the foregoing applications of the technique have been given by way of example only and are in no way to be considered as limiting.

We claim:

1. An apparatus for plasma treatment of a substrate, including a radio frequency (RF) generator coupled inductively to a reactor chamber in which a substrate may be disposed, a pulse generator coupled to the RF generator whereby the output of the RF generator consists of a series of pulse of radio frequency energy, means for evacuating the reactor chamber, and mean for supplying active or inert gases to the reactor chamber in a pulsed manner, wherein the apparatus is such that the plasma is generated adjacent the substrate surface, and wherein the output power of the RF generator is sufficient to achieve full dissociation of the plasma adjacent the substrate providing an energy density of at least 100 watts per cubic centimeter within the plasma.

2. An apparatus for plasma treatment of a substrate, including a radio frequency (RF) generator coupled inductively via an impedance matching unit to a reactor chamber in which a substrate may be disposed, a pulse generator coupled to the RF generator whereby the output of the RF generator consists of a series of pulses of radio frequency energy, means for supplying active or inert gases to the reactor chamber in a pulsed manner and means for traversing the plasma across the substrate surface whereby, at a given instant, only part of the substrate surface is in contact with the plasma, wherein the apparatus is such that the plasma is generated adjacent the substrate surface and wherein the output power of the RF generator is sufficient to achieve full dissociation of the plasma adjacent the substrate surface by providing an energy density of at least 100 watts per cubic centimeter within the plasma.

3. An apparatus as claimed in claim 2, wherein the plasma is restricted to a region of the substrate surface by a movable plasma shield.

4. An apparatus as claimed in claim 3, wherein the shield consists of an insulating rotatable disc having a sector shaped opening through which a portion of the substrate surface is exposed to the plasma.

5. An apparatus as claimed in claim 3, wherein the disc is provided with magnetic means for concentrating the plasma within the opening.

6. An apparatus as claimed in claim 2, wherein the radio frequency pulses are applied sequentially to a plurality of electrodes.

7. An apparatus as claimed in claim 2 or 3, and including means for providing to said chamber pulses of a reactive gas alternated by pulses of an inert gas.

8. An apparatus as claimed in claim 1 or 2, wherein the radio frequency generator includes an output stage driven with a buffer stage, and wherein the output stage is selectively enabled and disabled via a control signal applied to the buffer stage whereby a pulsed output is provided.

* * * * *